United States Patent
Lin et al.

(10) Patent No.: US 8,436,968 B2
(45) Date of Patent: May 7, 2013

(54) FLAT DISPLAY DEVICE INTEGRATED WITH PHOTOVOLTAIC CELL

(75) Inventors: Cheng-Tao Lin, Hsin-Chu (TW); En-Hung Liu, Hsin-Chu (TW); An-Thung Cho, Hsin-Chu (TW); Ching-Sheng Cheng, Hsin-Chu (TW)

(73) Assignee: Au Optronics Corp., Hsinchu (TW)

( * ) Notice: Subject to any disclaimer, the term of this patent is extended or adjusted under 35 U.S.C. 154(b) by 212 days.

(21) Appl. No.: 13/088,675

(22) Filed: Apr. 18, 2011

(65) Prior Publication Data

US 2011/0317121 A1    Dec. 29, 2011

(30) Foreign Application Priority Data

Jun. 28, 2010   (TW) ................................ 99121066 A

(51) Int. Cl.
*G02F 1/133* (2006.01)
(52) U.S. Cl.
USPC .......................................... 349/116; 349/149
(58) Field of Classification Search ................... 349/158, 349/116, 50, 199, 106, 110, 149, 153, 155; 345/207

See application file for complete search history.

(56) References Cited

U.S. PATENT DOCUMENTS

| | | | |
|---|---|---|---|
| 8,085,368 B2 * | 12/2011 | Kim et al. | 349/116 |
| 2007/0115399 A1 | 5/2007 | Brabec et al. | |
| 2008/0088758 A1 | 4/2008 | Shie | |

FOREIGN PATENT DOCUMENTS

| | | |
|---|---|---|
| JP | 63056683 | 3/1988 |
| JP | 2002077343 | 3/2002 |
| JP | 2007088280 | 4/2007 |

\* cited by examiner

*Primary Examiner* — Thoi Duong
(74) *Attorney, Agent, or Firm* — WPAT, PC; Justin King

(57) ABSTRACT

A flat display device integrated with a photovoltaic cell is disclosed. The flat display device includes a first substrate, a second substrate, a display medium layer, a first photovoltaic cell, a connecting layer and a conductive structure. The display medium layer is sealed between the first and second substrates. The first photovoltaic cell is disposed on the first substrate. The connecting layer is disposed on the second substrate and is capable of electrically connecting the first photovoltaic cell to an external circuit. The conductive structure is disposed between the first and second substrates, and is electrically connected with the first photovoltaic cell and the connecting layer.

19 Claims, 4 Drawing Sheets

FLAT DISPLAY DEVICE INTEGRATED WITH PHOTOVOLTAIC CELL

RELATED APPLICATIONS

This application claims priority to Taiwan Application Serial Number 99121066, filed Jun. 28, 2010, which is herein incorporated by reference.

BACKGROUND

1. Field of Invention

The present invention relates to a display device. More particularly, the present invention relates to a display device integrated with a photovoltaic cell.

2. Description of Related Art

Along with progresses of display technologies, the market of the traditional display using cathode ray tube (CRT), which is heavy and power consuming, is gradually decreased, and flat display panels displace the CRTs. Flat display panels are advantageous in lightweight, small volume, low emissivity and low power consumption, and already became the first choice when people purchase display devices. By the attention to the green energy, the power consumption becomes an important issue.

In order to reduce the power consumption of the display, a display device integrated with photovoltaic cells has been disclosed. In this technology, the ambient light and the light emitted by the backlight module are converted into an electrical current by the photovoltaic cell, and the electrical current generated by the photovoltaic cell is transmitted to the circuit in the display device to decrease the power demand of the entire display device.

However, the display devices equipped with photovoltaic cells has a problem in the transmission of the electricity from the photovoltaic cell in the display panel to the circuits. In the prior art, additional connection wires are employed to connect the display panel to the circuits, and therefore the electrical current generated by the photovoltaic cell may be transmitted to the circuits. The additional connection wires are disposed beside the display panel, and are usually pulled and dragged in the process of assembly. As a result, imperfect contact occurs between the additional connection wires and the display panel. Moreover, the above-mentioned approach is cost-ineffective.

SUMMARY

Therefore, one object of the present disclosure is to provide a liquid crystal display device integrated with a photovoltaic cell, and a flat display device integrated with a photovoltaic cell, which may improve the drawbacks in the prior art.

According to one aspect of the present disclosure, a liquid crystal display device integrated with a photovoltaic cell is provided. The liquid crystal display device includes a first substrate, a second substrate, a liquid crystal layer, a first photovoltaic cell, a connecting layer and a conductive structure. The second substrate is arranged in parallel with the first substrate, and the second substrate has a second inner surface facing a first inner surface of the first substrate. The liquid crystal layer is sealed between the two substrates. The first photovoltaic cell is disposed on the first substrate, and is arranged in a mesh shielding region and a peripheral region of the first substrate. The connecting layer is disposed on the second substrate and located at a position aligned with the peripheral region. The connecting layer is for electrically connecting to an external circuit. The conductive structure is sandwiched between the two substrates, and is disposed in the peripheral region. The conductive structure electrically connects the first photovoltaic cell to the connecting layer.

According to one embodiment of the present disclosure, the first photovoltaic cell includes a first electrode layer, a photovoltaic layer and a second electrode layer, wherein the photovoltaic layer is disposed between the first electrode layer and the second electrode layer.

According to one embodiment of the present disclosure, the connecting layer includes a first connecting pad and a second connecting pad, and both the connecting pads are aligned with the peripheral region of the first substrate.

According to one embodiment of the present disclosure, the conductive structure includes a first sub-conductive structure and a second sub-conductive structure. The first sub-conductive structure is electrically interconnected between the first electrode layer and the first connecting pad. The second sub-conductive structure is electrically interconnected between the second electrode layer and the second connecting pad.

According to one embodiment of the present disclosure, the liquid crystal display device further includes a first extending pad and a second extending pad. Both the two connecting layer are disposed on the first inner surface of the first substrate and aligned with the peripheral region. The first extending pad electrically connects the first electrode layer to the first sub-conductive structure. The second extending pad electrically connects the second electrode layer to the second sub-conductive structure.

According to one embodiment of the present disclosure, the liquid crystal display device further includes a common electrode disposed on the first substrate. The first and second extending pads are simultaneously formed with the common electrode.

According to one embodiment of the present disclosure, the liquid crystal display device further includes a pixel electrode disposed on the second substrate. The first and second connecting pads are simultaneously formed with the pixel electrode.

According to one embodiment of the present disclosure, the liquid crystal display device further includes a second photovoltaic cell disposed on the second inner surface of the second substrate and aligned with the mesh shielding region and the peripheral region.

According to one embodiment of the present disclosure, the connecting layer includes a first metal layer disposed on the second substrate, wherein the first metal layer is located at a position that is aligned with the peripheral region of the first substrate.

According to one embodiment of the present disclosure, the liquid crystal display device further includes a source/drain electrode disposed on the second substrate, wherein the first metal layer is formed simultaneously with the source/drain electrode.

According to one embodiment of the present disclosure, the liquid crystal display device further includes a second metal layer disposed on the second substrate, wherein the second metal layer is located at a position that is not overlapped by the display region of the first substrate, and the second metal layer electrically connects to an electrode of the second photovoltaic cell.

According to one embodiment of the present disclosure, the liquid crystal display device further includes a gate electrode disposed on the second substrate, wherein the second metal layer is formed simultaneously with the gate electrode.

According to one embodiment of the present disclosure, the liquid crystal display device further includes a sealant disposed between the first and second substrates and surrounding the liquid crystal layer, wherein the conductive structure is embedded in the sealant.

According to another aspect of the present disclosure, a flat display device integrated with a photovoltaic cell is provides. The flat display device includes a first substrate, a second substrate, a display medium layer, a first photovoltaic cell, a connecting layer and a conductive structure. The second substrate is arranged in parallel with the first substrate, and the second substrate has a second inner surface facing a first inner surface of the first substrate. The display medium layer is sealed between the two substrates. The first photovoltaic cell is disposed on the first substrate, and is arranged in a mesh shielding region and a peripheral region of the first substrate. The connecting layer is disposed on the second substrate and located at a position aligned with the peripheral region and another position that is not overlapped by the first substrate for electrically connecting to an external circuit. The conductive structure is sandwiched between the two substrates, and is disposed in the peripheral region. The conductive structure electrically connects the first photovoltaic cell to the connecting layer.

According to one embodiment of the present disclosure, the display medium layer is a liquid crystal layer, an organic light-emitting material layer, an electrophoretic layer or a plasma display layer.

According to the embodiments of the present disclosure, the first photovoltaic cell positioned on the first substrate is electrically connected to the connecting layer position on the second substrate by the conductive structure. Therefore, external wires used in the prior are no longer required, and thus is cost effective.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
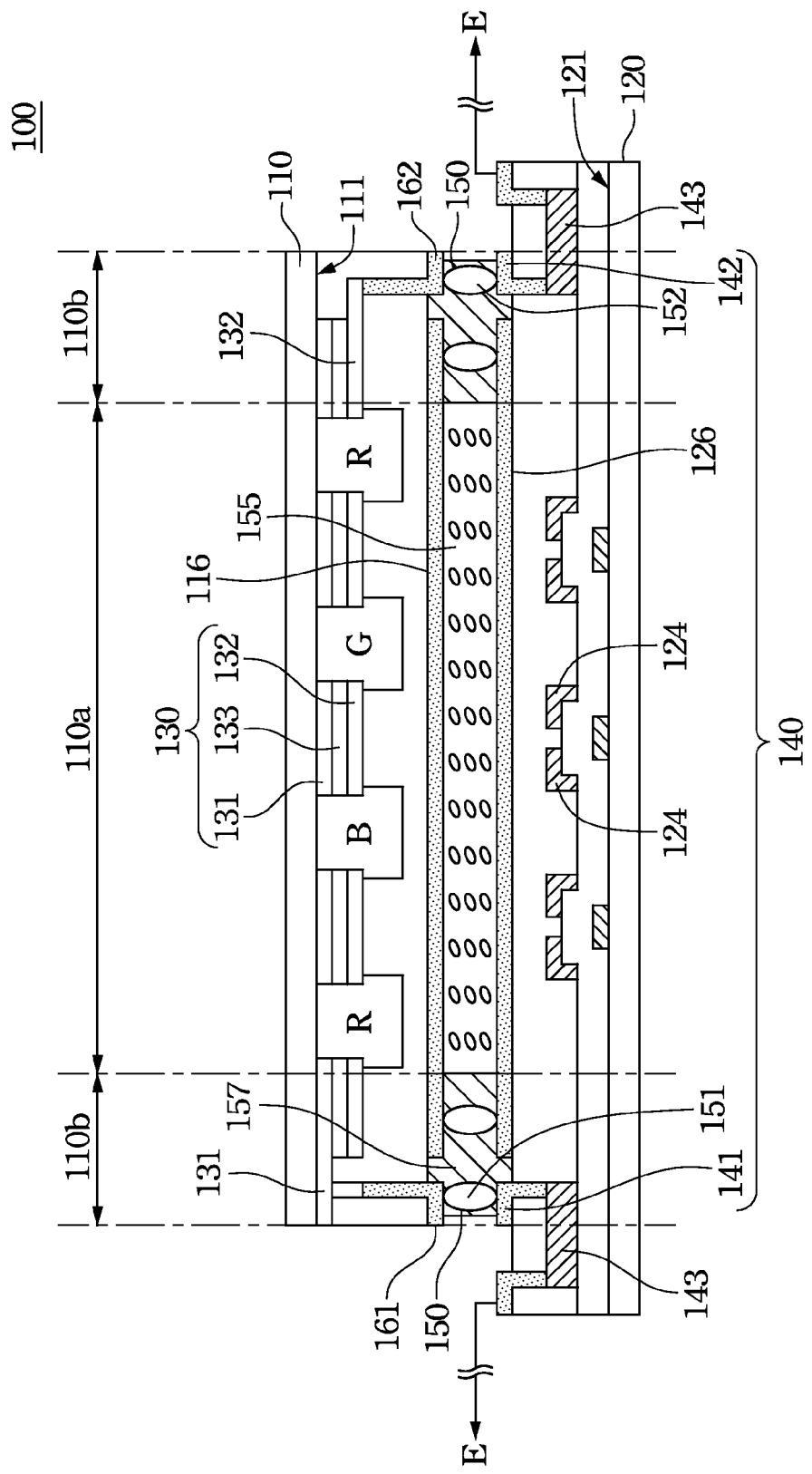
FIG. 1 is a cross-sectional view schematically illustrating a flat display device integrated with a photovoltaic cell according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

According to the embodiments of the flat display device disclosed herein, at least one photovoltaic cell is integrated in the flat display device. Both a conductive structure and a connecting layer are employed to transmit electrical energy, generated by the photovoltaic cell, to an external circuit. External wires used in the prior are no longer required, and therefore the manufacturing cost may be reduced, and the process may be simplified.

FIG. 1 is a cross-sectional view schematically illustrating a flat display device 100 integrated with a photovoltaic cell according to one embodiment of the present disclosure. Referring to FIG. 1, the flat display device 100 comprises a first substrate 110, a first photovoltaic cell 130, a second substrate 120, a connecting layer 140, a display medium layer 155 and a conductive structure 150. The first substrate 110 has a first inner surface 111, and the second substrate 120 has a second inner surface 121. The second substrate 120 is in parallel with the first substrate 110, and the first inner surface 111 faces the second inner surface 121. The first photovoltaic cell 130, the connecting layer 140, the display medium layer 155 and the conductive structure 150 are disposed between the first substrate 110 and second substrate 120.

The display medium layer 155 is sealed between the first substrate 110 and the second substrate 120. In this embodiment, the display medium layer 155, for example, can be a liquid crystal layer. However, the display medium layer 155 is not limited on the liquid crystal layer. The display medium layer 155 may be a liquid crystal layer, an organic light-emitting layer, an electrophoretic layer or a plasma display layer, which are known in the art and not described in detail herein. Specifically, when a liquid crystal layer is employed as the display medium layer 155, the flat display device 100 may be a liquid crystal display device, in which the first substrate 110 may be a color filter substrate and the second substrate 120 may be a thin-film transistor array substrate, for example. In one example, the area of the second substrate 120 is greater than that of the first substrate 110. When the first substrate 110 and the second substrate 120 are assembled and split, the second substrate 120 has an edge extending over a cut edge of the first substrate 110.

Figure 2:
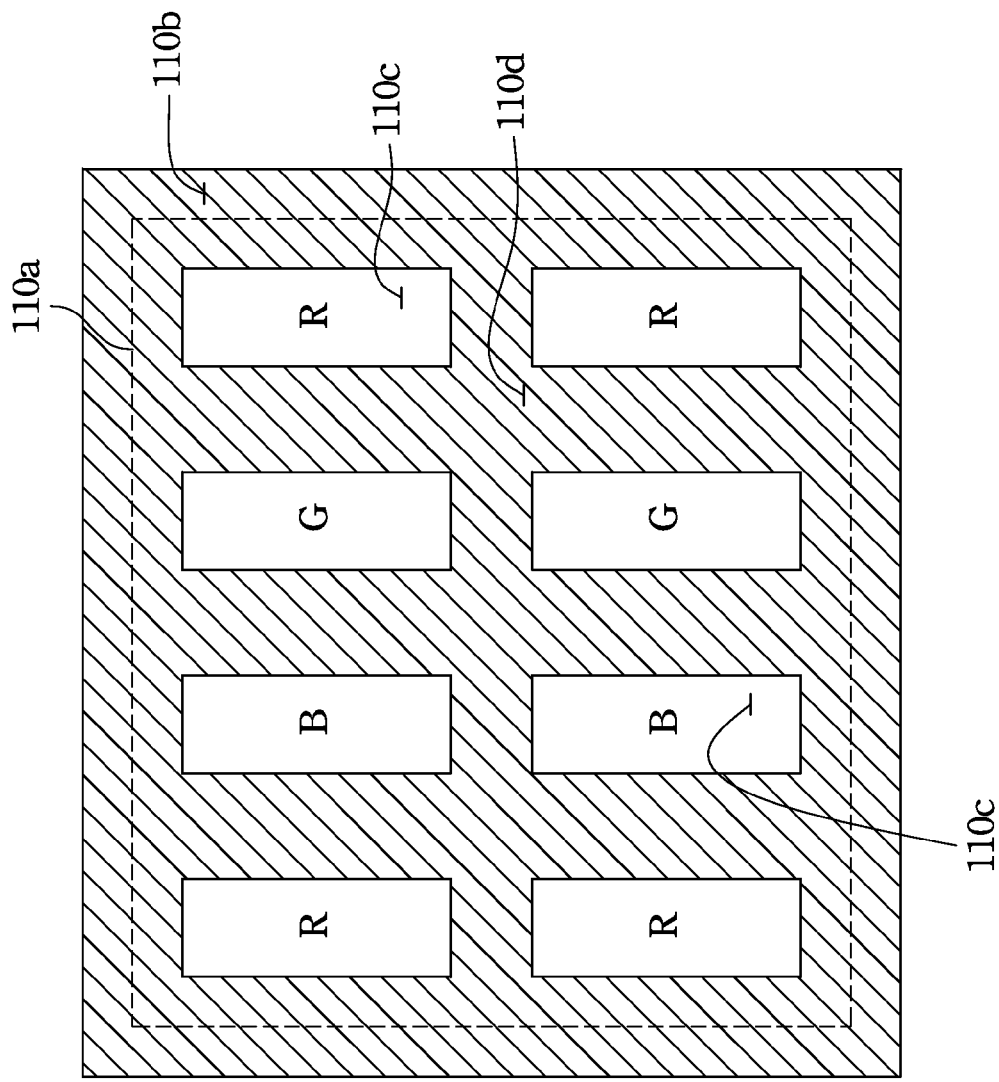
FIG. 2 schematically illustrates the display region and the peripheral region of the first substrate according to one embodiment of the present disclosure.

Specifically, the first substrate 110 has a display region 110a and a peripheral region 110b. With reference to FIG. 1 and FIG. 2, FIG. 2 schematically illustrates the display region 110a and the peripheral region 110b of the first substrate 110. The display region 110a has a plurality of display blocks 110c arranged in an array and a mesh shielding region 110d positioned between these display blocks 110c, which is well known in the art and not described in detail herein. The display region 110a is arranged corresponding to the display medium layer 155, while the peripheral region 110b surrounds the display region 110a. A plurality of color filter layers R, G, B may be arranged in these display blocks 110c of the first substrate 110, as depicted in FIG. 2. The mesh shielding region 110d may have a pattern that is the same as the black matrix of the first substrate 110.

In this embodiment, the first photovoltaic cell 130 is disposed on the first inner surface 111 of the first substrate 110, and is arranged in both the mesh shielding region 110d and the peripheral region 110b. Therefore, the first photovoltaic cell 130 in the display region 110a preferably has a mesh pattern that is aligned the mesh shielding region 110d. The connecting layer 140 is disposed on the second inner surface 121 of the second substrate 120. The connecting layer 140 is located at a position aligned with the peripheral region 110b of the first substrate 110 and may extended to an external position that is not overlapped by the first substrate 110. The conductive structure 150 is sandwiched between the first and second substrates 110, 120, and disposed in the peripheral region 110b. The conductive structure 150 electrically connects the first photovoltaic cell 130 to the connecting layer 140, which is used for connecting to an external circuit E. Therefore, electrical energy generated by the first photovoltaic cell 130 may be transmitted to the external circuit E, as depicted in FIG. 2.

The first photovoltaic cell 130 comprises a first electrode layer 131, a second electrode layer 132 and a photovoltaic layer 133 disposed between the first and second electrode layers 131, 132. The material of the first electrode layer 131 may be a transparent conductive material, for example, indium tin oxide (ITO), indium zinc oxide (IZO), aluminum zinc oxide (AZO), or a metal such as aluminum, copper, silver, gold, titanium, molybdenum and tungsten. The photovoltaic layer 133 may be a silicon rich dielectric layer having high photosensitivity, for example. When the photovoltaic layer 133 absorbs light, electron-hole pairs are generated in the photovoltaic layer 133, and thus forming a photocurrent. In one example, the silicon rich dielectric layer comprises a material selected from the group consisting of silicon rich oxide ($SiO_x$), silicon rich nitride ($SiN_y$), silicon rich oxynitride ($SiO_xN_y$), silicon rich carbide ($SiC_z$), silicon rich oxycarbide ($SiO_xC_z$), hydrogenated silicon rich oxide ($SiH_wO_x$), hydrogenated silicon rich nitride ($SiH_wN_y$), hydrogenated silicon rich carbide ($SiH_wN_y$) and any combinations thereof, wherein $0<w<4$, $0<x<2$, $0<y<1.34$, and $0<z<1$. In the abovemention material, the stoichiometry of silicon is greater than other elements. The thickness of the silicon rich dielectric layer can be thin, and more easily to be integrated onto the first substrate.

The connecting layer 140 comprises a first connecting pad 141 and a second connecting pad 142. The arrangements of the first and second connecting pads 141,142 are aligned with the peripheral region 110b of the first substrate 110. The conductive structure 150 comprises a first sub-conductive structure 151 and a second sub-conductive structure 152. The first sub-conductive structure 151 is electrically interconnected between the first connecting pad 141 and the first electrode layer 131 of the first photovoltaic cell 130. The second sub-conductive structure 152 is electrically interconnected between the second connecting pad 142 and the second electrode layer 132 of the first photovoltaic cell 130.

In one embodiment, the liquid crystal display device 100 may further comprises a first extending pad 161 and a second extending pad 162. The first and second extending pads 161, 162 are disposed on the first inner surface 111 of the first substrate 110, and are aligned with the peripheral region 110b. The first extending pad 161 electrically connects with the first sub-conductive structure 151 and the first electrode layer 131 of the first photovoltaic cell 130. The second extending pad 162 electrically connects with the second sub-conductive structure 152 and the second electrode layer 132 of the first photovoltaic cell 130.

Figure 3:
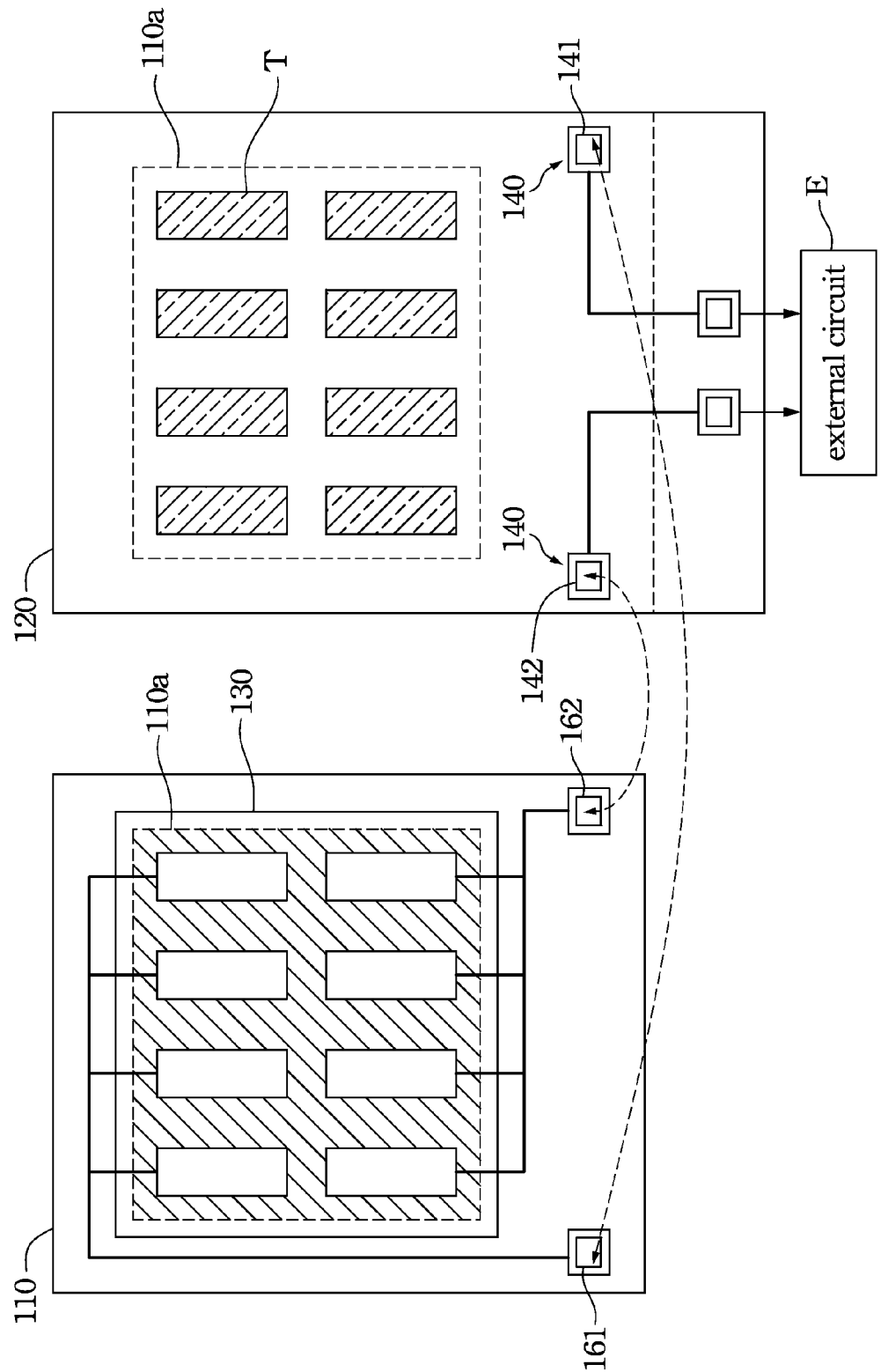
FIG. 3 schematically illustrates the electrical connection between the first photovoltaic cell and the external circuit.

FIG. 3 schematically illustrates the electrical connection between the first photovoltaic cell and the external circuit. With reference to FIG. 1 and FIG. 3, the first photovoltaic cell 130 is positioned on the first substrate 110. The first extending pad 161 and the second extending pad 162 are position in the peripheral region 110b, which is out of the display region 110a. The first and second extending pads 161, 162 respectively electrically connect to the first and second electrode layers 131, 132. The second substrate 120 comprises a number of pixel structures T, which are formed in the display region 110a. Each of the pixel structures T may comprise a thin-film transistor and a pixel electrode. The first extending pad 161 electrically connects to the first connecting pad 141 of the connecting layer 140, and is further electrically connected to the external circuit E by the connecting layer 140. Similarly, the second extending pad 162 electrically connects to the second connecting pad 142 of the connecting layer 140, and is further electrically connected to the external circuit E by the connecting layer 140.

By this way, the electrical energy may be transmitted from the first substrate 110 to the second substrate 120, through the first and second electrode layers 131, 132 of the first photovoltaic cell 130, and further be transmitted to the external circuit E. More specifically, electrical energy may be transmitted from the first electrode layer 131 of the first substrate 110 to the external circuit E through the first extending pad 161, the first sub-conductive structure 151 and the first connecting pad 141; simultaneously, electrical energy may be transmitted from the second electrode layer 132 of the first substrate 110 to external circuit E through the second extending pad 162, the second sub-conductive structure 152 and the second connecting pad 142.

In this embodiment, electrical energy, generated by the first photovoltaic cell 130 formed on the first substrate 110, is transmitted to the second substrate 120 through the conductive path formed in the flat display device 100, and is further transmitted to the external circuit E. The external wires connecting with the first and second substrates 110, 120 are no longer required because a reliable conductive path is provided in the flat display device 100. Therefore, the manufacturing cost may be reduced, and the fabricating process may be simplified.

Referring back to FIG. 1, the flat display device 100 may further comprises a common electrode 116 disposed on the first substrate 110. The common electrode 116 may be simultaneously formed with the formation of the first and second extending pads 161, 162. In particular, after forming the first photovoltaic cell 130 and the color filter layers R, G, B on the first inner surface 111 of the first substrate 110, a protective layer is formed to cover the first photovoltaic cell 130 and the color filter layers. Subsequently, two contact holes are formed in the protective layer by etching to expose the first electrode layer 131 and the second electrode layer 132 of the first photovoltaic cell 130. A layer of indium tin oxide (ITO) is then deposited on the protective layer, and the ITO layer is patterned to form the first extending pad 161, the second extending pad 162 and the common electrode 116. The first extending pad 161, the second extending pad 162 and the common electrode 116 are electrically isolated. The first and second extending pads 161, 162 are respectively in contact with the first and second electrode layers 131, 132. In this embodiment, the first and second extending pads 161, 162 are simultaneously formed with the common electrode 116. Therefore, the formation of the first and second extending pads 161, 162 does not require additional material or processes, and thus the manufacturing cost may be reduced. Moreover, the process compatibility of forming the first and second extending pads 161, 162 is excellent in this embodiment.

Furthermore, the flat display device 100 may comprises a pixel electrode 126 disposed on the second substrate 120. The pixel electrode 126 may be simultaneously formed with the first and second connecting pads 141, 142. Similar to the above description, the first connecting pad 141, the second connecting pad 142 and the pixel electrode 126 are formed by depositing and patterning an ITO layer sequentially. The first connecting pad 141, the second connecting pad 142 and the pixel electrode 126 discussed herein are electrically isolated.

Because the first and second connecting pad 141, 142 and the pixel electrode 126 are simultaneously formed, additional material is not required. Therefore, the manufacturing cost may be reduced and the process compatibility is excellent.

In one example, the connecting layer 140 comprises a first metal layer 143 disposed on the second substrate 120, and the first metal layer 143 is located at a position that is not overlapped by the display region 110a of the first substrate 110. The material of the first metal layer 143 may be aluminum, copper, silver, gold, titanium, molybdenum, tungsten or a combination thereof. The first metal layer 143 may reduce the resistance of the connecting layer, and therefore are facilitate to the transmission of the electrical energy. In another example, the connecting layer 140 may be replaced by the first metal layer 143. In addition, the first metal layer 143 may comprises two portions. One portion of the first metal layer 143 can be in contact with the first connecting pad 141 while the other portion can be in contact with the second connecting pad 142. The two portions of the first metal layer 143 may reduce the resistance of the conductive path from the first electrode layer 131 to the external circuit E through the connecting layer 140, as well as the resistance of the conductive path from the second electrode layer 132 to the external circuit E through the connecting layer 140.

The flat display device 100 may further comprise a plurality of transistors disposed on the second substrate 120. Each of the transistors includes source/drain electrodes 124 electrically connect to a corresponding pixel electrode 126 and a corresponding data line, respectively. In one example, the first metal layer 143 of the connecting layer 140 is formed simultaneously with the formation of the source/drain electrodes 124. Therefore, formation of the first metal layer 143 does not require any additional process, and therefore does not increase the manufacturing cost.

In this embodiment, although the conductive structure 150 is illustrated as a conductive ball in FIG. 1, the present disclosure, however, is not limited thereon. Other means may be employed to electrically connect the first extending pad 161 to the first connecting pad 141, and to electrically connect the second extending pad 162 to the second connecting pad 142. For instance, the conductive structure 150 may be a conductive glue, a conductive column, or a combination of conductive glue, conductive columns and conductive balls. The conductive column may be a column-shaped elastic spacer coated with a conductive layer. For example, the conductive column may be coated with the material of the first extending pad 161 and/or the second extending pad 162. The conductive ball may be a golden ball or a flexible conductive ball coated with a conductive layer. Furthermore, the flat display device 100 may further comprise a sealant 157 disposed between the first and second substrates 110, 120. The sealant 157 surrounds the display medium layer 155. The conductive structure 150 may be disposed inside the sealant 157 or outside the sealant 157. The sealant 157 and the conductive structure 150 may be formed simultaneously by coating a sealant material comprising the conductive structures. The photovoltaic cell 130 may be electrically connected to the connecting layer 140 through the conductive structure 150 disposed between the first and second substrates 110, 120, and the photovoltaic cell 130 may be further electrically connected to the external circuit E. Therefore, external connection wires on the first substrate 110 are not required in the present invention. The issue of space occupied by the wires may be prevented, and the manufacturing process may be simplified.

Figure 4:
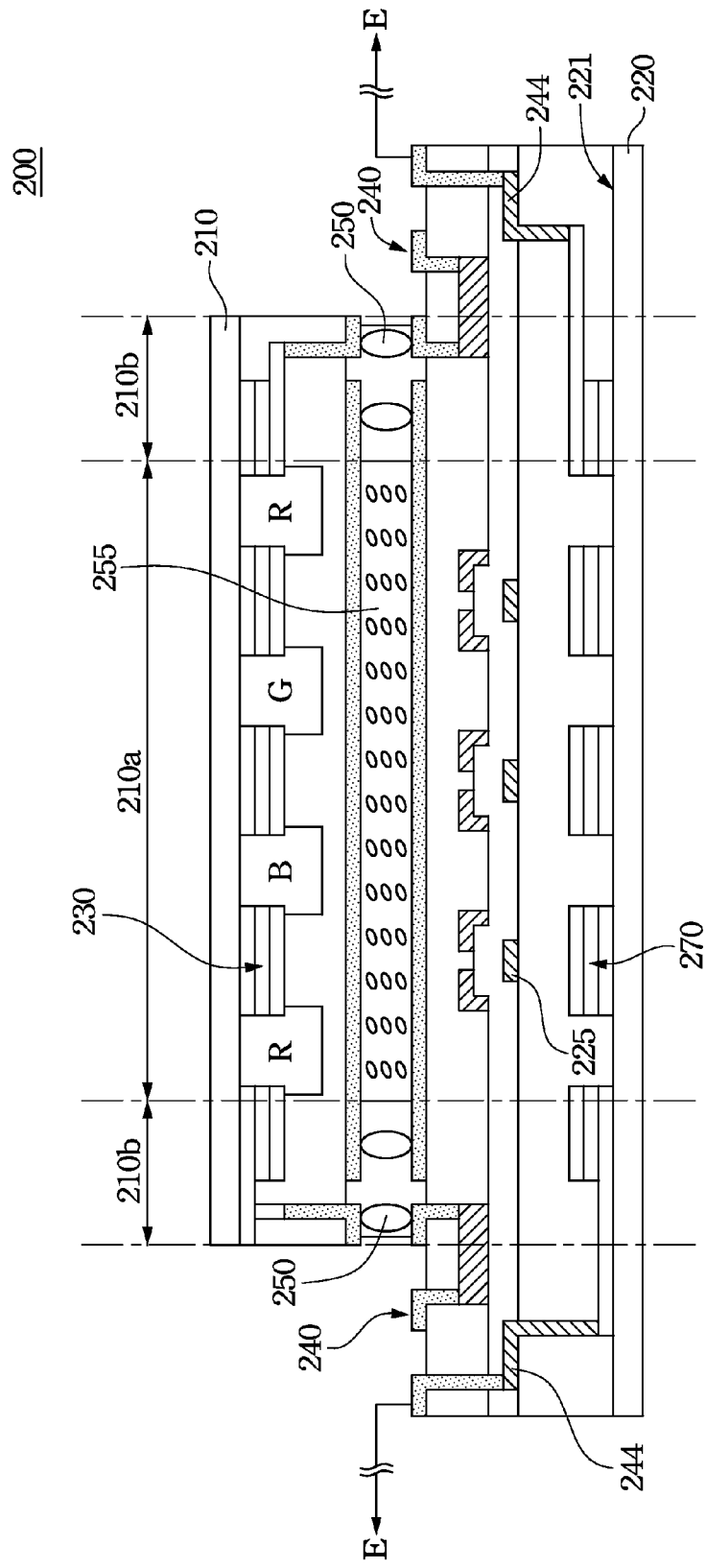
FIG. 4 is a cross-sectional view schematically illustrating a flat display device according to another embodiment of the present disclosure.

The embodiment described above illustrates that the flat display device 100 has a first photovoltaic cell 130 integrated in the first substrate 110. However, the present disclosure is not limited to the structure having single photovoltaic cell. FIG. 4 is a cross-sectional view schematically illustrating a flat display device 200 according to another embodiment of the present disclosure. The flat display device 200 may further comprise a second photovoltaic cell 270 integrated therein. In the flat display device 200, the first photovoltaic cell 230 is disposed on the first inner surface 211 of the first substrate 210. The second photovoltaic cell 270 is disposed on the second inner surface 221 of the second substrate 220.

The design and the arrangement of the first substrate 210, the display medium layer 255, the connecting layer 240, the conductive structure 250 of the flat display device 200 may be the same as these described above in connection with the flat display device 100 in FIG. 1. In this embodiment, the second photovoltaic cell 270 is disposed on the second inner surface 221 of the second substrate 220 and is aligned with the mesh shielding region and the peripheral region 210b. For instance, the second photovoltaic cell 270 may be arranged below the data lines and the scan lines. Since both the first photovoltaic cell 230 and the second photovoltaic cell 270 are disposed in the mesh shielding region and the peripheral region 210b, the first photovoltaic cell 230 and the second photovoltaic cell 270 may substantially has the same pattern. Therefore, the aperture ratio of the flat display device 200 does not decrease. Furthermore, the two electrodes of the second photovoltaic cell 270 may electrically connected to the external circuit E through the conductive path formed in the second substrate 220.

In particular, the flat display device 200 may further comprise a second metal layer 244 disposed on the second substrate 220. The second metal layer 244 is located at a position that is not overlapped by the display region 210a of the first substrate 210. The second metal layer 244 electrically connects to at least one electrode of the second photovoltaic cell 270. The second metal layer 244 is operable to reduce the resistance of the conductive path from the second photovoltaic cell 270 to the external circuit E, and thus increasing the efficiency of energy transmission. In some examples, the second photovoltaic cell 270 may directly connect to the connecting layer 240. Alternatively, the second photovoltaic cell 270 may directly connect to the first metal layer. In addition, the flat display device 200 has a gate electrode 225 disposed on the second substrate 220. The second metal layer 244 may be formed simultaneously with the gate electrode 225, and thus the formation of the second metal layer 244 does not require any additional process.

According to the embodiments described hereinbefore, the photovoltaic cell positioned on the first substrate may be electrically connected to the connecting layer of the second substrate through the conductive structure sandwiched between the first and second substrates, and further be electrically connected to an external circuit. By this way, external wires are not required in the present disclosure, and the issue of the space occupied by the wires may be prevented. Imperfect contacts due to the pull and drag of the external wires occurred in the assembly procedure may be prevented as well, and a reliable quality of electrical connection may be provided. In addition, the manufacturing process may be simplified. Furthermore, the conductive structure and the connecting layer may be formed by the process that is originally required in the fabrication of the display device. Therefore, the present disclosure is advantageous in both high process compatibility and low manufacturing cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A liquid crystal display device, comprising
    a first substrate having a first inner surface, wherein the first substrate comprises a display region and a peripheral region, and the display region has a plurality of display blocks arranged in an array and a mesh shielding region positioned between the display blocks;
    a second substrate arranged in parallel with the first substrate, wherein the second substrate has a second inner surface facing the first inner surface;
    a liquid crystal layer sealed between the first substrate and the second substrate;
    a first photovoltaic cell disposed on the first inner surface of the first substrate and located in the mesh shielding region and the peripheral region;
    a connecting layer for connecting to an external circuit being disposed on the second inner surface of the second substrate, the connecting layer being aligned with the peripheral region of the first substrate; and
    a conductive structure being sandwiched between the first substrate and the second substrate in the peripheral region, wherein the conductive structure is electrically connected between the first photovoltaic cell and the connecting layer.

2. The liquid crystal display device according to claim 1, wherein the first photovoltaic cell comprises a first electrode layer, a second electrode layer, and a photovoltaic layer disposed therebetween.

3. The liquid crystal display device according to claim 2, wherein the photovoltaic layer comprises a silicon rich dielectric layer.

4. The liquid crystal display device according to claim 3, wherein the silicon rich dielectric layer comprises a material selected from the group consisting of silicon rich oxide, silicon rich nitride, silicon rich oxynitride, silicon rich carbide, silicon rich oxycarbide, hydrogenated silicon rich oxide, hydrogenated silicon rich nitride, hydrogenated silicon rich carbide and any combinations thereof.

5. The liquid crystal display device according to claim 2, wherein the connecting layer comprises a first connecting pad and a second connecting pad, wherein the first and second connecting pads are aligned with the peripheral region of the first substrate.

6. The liquid crystal display device according to claim 5, wherein the conductive structure comprises a first sub-conductive structure and a second sub-conductive structure, wherein the first sub-conductive structure is electrically interconnected between the first electrode layer and the first connecting pad, and the second sub-conductive structure is electrically interconnected between the second electrode layer and the second connecting pad.

7. The liquid crystal display device according to claim 6, further comprising:
    a first extending pad disposed on the first inner surface of the first substrate and aligned with the peripheral region, wherein the first extending pad electrically connects the first electrode layer to the first sub-conductive structure; and
    a second extending pad disposed on the first inner surface of the first substrate where is aligned with the peripheral region, wherein second extending pad electrically connects the second electrode layer to the second sub-conductive structure.

8. The liquid crystal display device according to claim 7, further comprising a common electrode disposed on the first substrate, wherein the first and second extending pads and the common electrode are formed simultaneously.

9. The liquid crystal display device according to claim 5, further comprising a pixel electrode disposed on the second substrate, wherein the first and second connecting pads and the pixel electrode are formed simultaneously.

10. The liquid crystal display device according to claim 1, wherein the conductive structure includes a conductive glue, a conductive column, a conductive ball or a combination thereof.

11. The liquid crystal display device according to claim 1, further comprising a second photovoltaic cell disposed on the second inner surface of the second substrate and aligned with the mesh shielding region and the peripheral region.

12. The liquid crystal display device according to claim 11, wherein the connecting layer comprises a first metal layer disposed on the second substrate, wherein the first metal layer is aligned with the peripheral region.

13. The liquid crystal display device according to claim 12, further comprising a source/drain electrode disposed on the second substrate, wherein the first metal layer and the source/drain electrode are formed simultaneously.

14. The liquid crystal display device according to claim 11, further comprising a second metal layer disposed on the second substrate, wherein the second metal layer is aligned with the peripheral region, and the second metal layer electrically connects to at least one electrode of the second photovoltaic cell.

15. The liquid crystal display device according to claim 14, further comprising a gate electrode disposed on the second substrate, wherein the second metal layer and the gate electrode are formed simultaneously.

16. The liquid crystal display device according to claim 1, further comprising a sealant disposed between the first and second substrates and surrounding the liquid crystal layer, wherein the conductive structure is embedded in the sealant.

17. A flat display device, comprising:
    a first substrate having a first inner surface, wherein the first substrate comprises a display region and a peripheral region, and the display region has a plurality of display blocks arranged in an array and a mesh shielding region positioned between the display blocks;
    a second substrate arranged in parallel with the first substrate, wherein the second substrate has a second inner surface facing the first inner surface;
    a display medium layer sealed between the first substrate and the second substrate;
    a first photovoltaic cell disposed on the first inner surface of the first substrate and located in the mesh shielding region and the peripheral region;
    a connecting layer for connecting to an external circuit being disposed on the second inner surface of the second substrate, the connecting layer being aligned with the peripheral region of the first substrate; and
    a conductive structure being sandwiched between the first substrate and the second substrate in the peripheral region, wherein the conductive structure is electrically connected between the first photovoltaic cell and the connecting layer.

18. The flat display device according to claim 17, further comprising a second photovoltaic cell disposed on the second inner surface of the second substrate and aligned with the mesh shielding region and the peripheral region.

19. The flat display device according to claim 17, wherein the display medium layer includes a liquid crystal layer, an organic light-emitting layer, an electrophoretic layer or a plasma display layer.

\* \* \* \* \*